United States Patent [19]
Jang

[11] Patent Number: 5,804,476
[45] Date of Patent: Sep. 8, 1998

[54] METHOD OF FORMING BICMOS DEVICES HAVING MOSFET AND BIPOLAR SECTIONS THEREIN

[75] Inventor: Young-Soo Jang, Kyungki-do, Rep. of Korea

[73] Assignee: Samsung Electronics Co., Ltd., Rep. of Korea

[21] Appl. No.: 758,848

[22] Filed: Dec. 2, 1996

[30] Foreign Application Priority Data

Nov. 30, 1995 [KR] Rep. of Korea ...................... 95-45627

[51] Int. Cl.⁶ ............................................... H01L 21/8238
[52] U.S. Cl. .......................... 438/202; 438/234; 438/303; 438/305; 438/307; 438/321; 438/558; 438/564; 148/DIG. 9; 148/DIG. 124; 257/273; 257/378
[58] Field of Search ..................... 438/234, 202, 438/303, 305, 307, 321, 558, 564, 219, 322, 353; 148/DIG. 9, DIG. 124; 257/273, 378

[56] References Cited

U.S. PATENT DOCUMENTS

| | | |
|---|---|---|
| 4,669,177 | 6/1987 | D'Arrigo et al. ........................ 29/571 |
| 4,960,726 | 10/1990 | Lechaton et al. ........................ 438/234 |
| 4,963,502 | 10/1990 | Teng et al. ................................ 437/41 |
| 5,006,476 | 4/1991 | De Jong et al. .......................... 437/31 |
| 5,162,966 | 11/1992 | Fujihira .................................... 257/140 |
| 5,348,896 | 9/1994 | Jang et al. ................................ 437/31 |
| 5,407,847 | 4/1995 | Hayden et al. ........................... 437/44 |
| 5,643,810 | 7/1997 | Jang ........................................ 437/31 |

Primary Examiner—John Niebling
Assistant Examiner—Long Pham
Attorney, Agent, or Firm—Myers Bigel Sibley & Sajovec, P.A.

[57] ABSTRACT

A BiCMOS device and a manufacturing method thereof according to the present invention has a gate insulating layer of NMOSFET having non-uniform thickness. The thickness of the end portion of the gate insulating layer, which is near LDD regions, is thicker than that of center portion. Therefore, the GIDL and the gate-drain overlap capacitance is reduced. In addition, in case of the bipolar transistor of the BiCMOS device, there exists a portion of an oxide film below the side portion of the emitter polysilicon and over the side portions of the emitter region. Since this structure serves as a gate of field effect transistor, N- channel is produced in the emitter region when the emitter-base junction is reversely biased and thus the hot carrier reliability is improved.

13 Claims, 6 Drawing Sheets

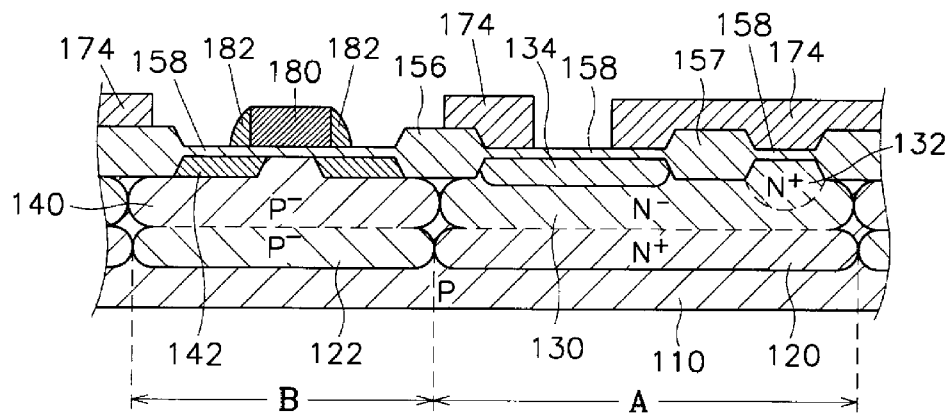
FIG.2F(Prior Art)
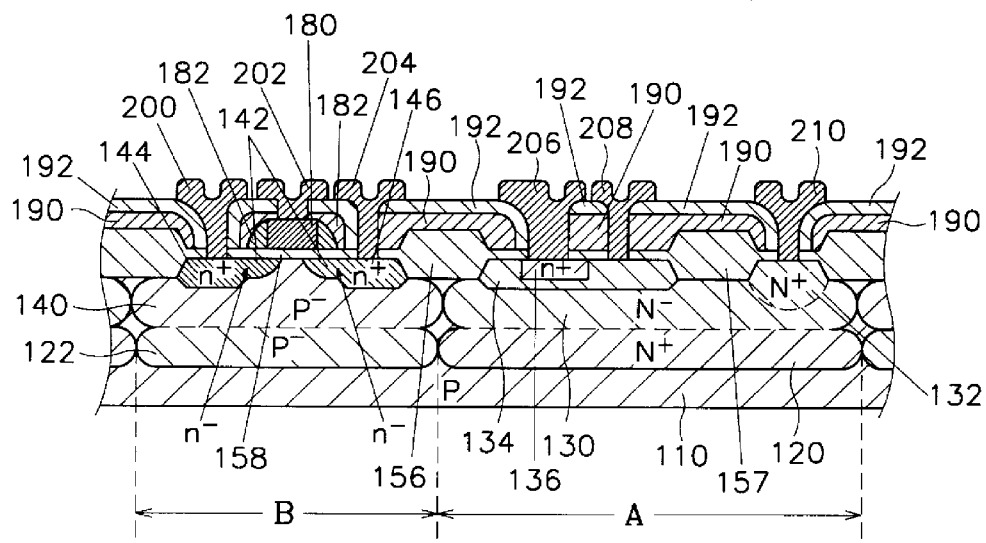
FIG.2G(Prior Art)
FIG.3
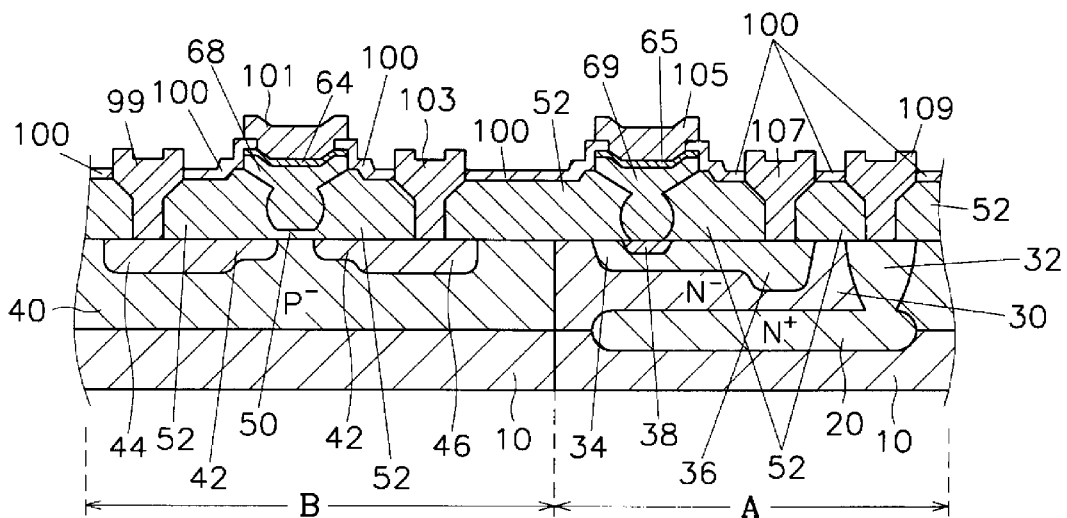

METHOD OF FORMING BICMOS DEVICES HAVING MOSFET AND BIPOLAR SECTIONS THEREIN

BACKGROUND OF THE INVENTION

1. Field of the Invention

The present invention relates a semiconductor device and a manufacturing method thereof. More particularly, the present invention relates to a BiCMOS (bipolar complementary metal-oxide-semiconductor) device having a lightly-doped drain (hereinafter referred to as an LDD) MOSFET (metal-oxide-semiconductor field effect transistor) and a bipolar transistor.

2. Description of the Related Art

As the scale of semiconductor devices such as transistors becomes small, the characteristics of the devices become worse due to the hot carrier effect. In case of bipolar transistors, when a heavily doped emitter-base junction of a bipolar transistor is reversely biased, a strong electric field is produced because of the concentration of the electric fields. As a result, the electrons near the junction are accelerated and thus the hot carrier effect happens. In case of MOSFETs, the similar hot carrier effect happens.

In order to reduce the hot carrier effect in MOS devices, various gate-overlapped LDD structures are suggested (see IEEE 1991, p. 541–544), which is incorporated by reference herein. The overlapped LDD structure such as ITLDD (inverse-T type LDD), LATID (large-tilt-angle implanted drain) or GOLD (gate-drain overlapped LDD) improves a hot carrier reliability, but this structure induces a large gate-induced drain leakage (GIDL) and exhibits a high gate-drain overlap capacitance which decreases circuit performance.

A BiCMOS device generally includes bipolar transistors, NMOSFETs, and PMOSFETs.

A conventional BiCMOS device having an overlapped LDD structure and a manufacturing method thereof is described with reference to attached figures. For convenience, the PMOSFET is not shown in the figures and not described.

FIG. 1 shows a cross sectional view of a conventional BiCMOS device.

An NPN bipolar transistor is formed in the bipolar section A, while an NMOSFET being formed in the NMOSFET section B.

An N+buried layer 120 along with a P-buried layer 122 adjacent to the N+buried layer 120 is formed on a silicon substrate 110 in the bipolar section A and the NMOSFET section B, respectively.

An N-well 130 and a P-well 140 are formed on the N+buried layer 120 and the P-buried layer 122, respectively. A deep collector region 132 of N+type and a base region 134 of P type separated from each other are formed in the N-well 130, and an emitter region 136 is formed in the base region 134.

A source region 144 and a drain region 146 of N types separated from each other are formed in the P-well 140. LDD regions 142 are formed in the source region 144 and the drain region 146, respectively.

An oxide film 158 having thick portions 156 and 157 is formed on the surface of the substrate 110. The thick portions 156 lie on the surface between the bipolar section A and the NMOSFET section B and the thick portion 157 lie on the surface between the collector region 132 and the base region 134.

A gate polysilicon 180 having a sidewall 182 on its lateral side is formed on the oxide film 158 lying on the surface between the source region 144 and the drain region 146. The gate polysilicon 180 is overlapped with the LDD regions 142.

An insulating film, consisting of a lower oxide layer 190 and an upper BPSG (borophosphosilicate glass) layer 192 formed thereon, is formed on the oxide film 158 and the gate polysilicon 180.

The oxide film 158 and the insulating film 190 and 192 has a plurality of contact holes formed on the regions 132, 134, 136, 144 and 146. Through the contact holes, the regions 144, 146, 136, 134 and 132 are in contact with metal electrodes 200, 204, 206, 208 and 210. In addition, the insulating film 190 and 192 further has a contact hole through which the gate polysilicon 180 and a gate electrode 202 are connected to each other.

A manufacturing method of the BiCMOS device shown in FIG. 1 is described with reference to section views of FIGS. 2A to 2G.

A P-buried layer 122 and an N+buried layer 120 are formed on the NMOSFET section B and the bipolar section A of the substrate 110, respectively. An epitaxial layer 124, a thin oxide film 150, a nitride film 160 and a photoresist pattern 170 are sequentially deposited on the P-buried layer 122 and the N+buried layer 120. Then, a photoresist pattern 170 and a nitride film 160 is patterned to cover the surface of the NMOSFET section B as shown in FIG. 2A. Sequentially, N type ions is implanted into the bipolar section A by using the photoresist pattern 170 and the nitride film 160 as a mask, and the photoresist pattern 170 is removed for a selective oxidation process.

A field oxide 152 is formed on the surface of bipolar section A by using a selective oxidation process, and the nitride film 160 is removed. During the oxidation, an N-well 130 is formed on the N+buried layer 120. By implanting and diffusing P type ions, a P-well 140 is formed on the P-buried layer 122, so a twin-well structure is formed as shown in FIG. 2B.

After both the oxide film 150 and the field oxide 152 are removed, an oxide film 154 is formed on the surfaces of both sections A and B. Thereafter, a nitride film 162 is formed on the surface of the NMOSFET section B and formed on the part of the surface of bipolar section A, as shown in FIG. 2C.

Next, by using a selective oxidation method, a field oxide 156 and 157 is formed to isolate the device, and the nitride film 162 and the oxide film 154 are removed. An oxide film 158 having thick portions of the field oxide 156 and 157 is formed, and ions are implanted for adjusting breakdown voltage. The deep collector region 132 of N+type is formed in the N-well 130, and a gate polysilicon 180 is formed on the oxide film 158 in the NMOSFET section B, as shown in FIG. 2D.

A low temperature oxide film is deposited and patterned by using a RIE (reactive ion etch) method to form a sidewall 182 on the lateral side of the gate polysilicon 180. As shown in FIG. 2E, a photoresist pattern 172 is formed on the NMOSFET section B and on surface of the collector region 132 of the bipolar section A, and P type ions is implanted in low concentration.

The base region 134 in the bipolar section A is formed by diffusion process, and the photoresist pattern 172 is removed. After a photoresist pattern 174 is formed on the surface of the substrate as shown in FIG. 2F, N type ions is implanted with high concentration for a source region 144, a drain region 146 and an emitter region 136.

The source and the drain regions 144 and 146 are formed in the P-well 140, and an emitter region 136 is formed in the base region 134 by diffusing the implanted ions, as shown in FIG. 2G. After the photoresist pattern 174 is removed, a low temperature oxide layer 190 and a BPSG layer 192 are deposited. The BPSG layer 192, the oxide layer 190 and the oxide film 158 are patterned to make contact holes on the surface of a plurality of the regions 132, 134, 136, 144 and 146 and the gate polysilicon 180. Finally, metal electrodes 200, 204, 206, 208, 210 and 202 are in contact with the regions 144, 146, 136, 134 and 132 and the gate polysilicon 180 through the contact holes. There may be formed silicide layers (not shown) between the electrodes 200, 204, 206, 208, 210 and 202 and a plurality of the regions 144, 146, 136, 134 and 132 and the gate polysilicon 180.

As described above, the conventional BiCMOS device having an overlapped LDD structure has a problem that it induces a large gate-induced drain leakage (GIDL) and exhibits a high gate-drain overlap capacitance which strongly decreases a circuit performance. Furthermore, since the sidewall is made by RIE method, the thickness of the gate polysilicon determines the width of the sidewall. Therefore, the step coverage becomes worse since the gate polysilicon has enough thickness to get sufficient width of the sidewall.

SUMMARY OF THE INVENTION

An object of the present invention is to improve a hot carrier reliability. Another object of the present invention is to decrease GIDL and gate-drain overlap capacitance.

A MOSFET having LDD structure according to the present invention includes a gate insulating layer wherein the thickness of the end portion of the gate insulating layer is thicker than its center portion. Therefore, since the end portion of the gate insulating layer is near the LDD regions, the GIDL and the gate-drain overlapping capacitance is reduced.

A bipolar transistor according to the present invention includes an emitter electrode having a convex shape. An oxide film is formed between the end portions of the emitter electrode and the emitter regions. Since this structure serves as a gate of field effect transistor, N-channel is produced in the emitter region when an emitter-base junction is reversely biased. Therefore, the hot carrier reliability is improved.

In a manufacturing method of a BiCMOS device according to the present invention, a first polysilicon layer, a first oxide film and a first nitride film are sequentially deposited on a first insulating layer which is formed on a semiconductor substrate, and are patterned to form a gate pattern and an emitter pattern. After sidewalls of the gate pattern and the emitter pattern is formed, ion implantation for a source region, a drain region, and an extrinsic region are performed. Thereafter an oxidation process is performed. The first polysilicon layer of the gate pattern and the emitter pattern becomes to have a convex shape due to a non-uniform oxidation of the first polysilicon layer. Moreover, an upper portion and a lower portion of the first polysilicon layer is oxidized faster than the center portion of the first polysilicon layer. After the first oxide film and the first nitride film are removed, the first polysilicon layer of the emitter pattern and the first insulating film under the emitter pattern are removed. A second polysilicon layer is deposited and patterned to form a first gate electrode and a first emitter electrode.

BRIEF DESCRIPTION OF THE DRAWINGS

The present invention will become more fully understood from the detailed description given herein below and the accompanying drawings which are given by way of illustration only, and thus are not limitative of the present invention and wherein:

FIG. 2A to 2G are sectional views illustrating a method for manufacturing the conventional BiCMOS device shown in FIG. 1;

FIG. 3 is a sectional view of a BiCMOS device according to the embodiment of the present invention.

DETAILED DESCRIPTION OF THE PREFERRED EMBODIMENTS

Figure 1:
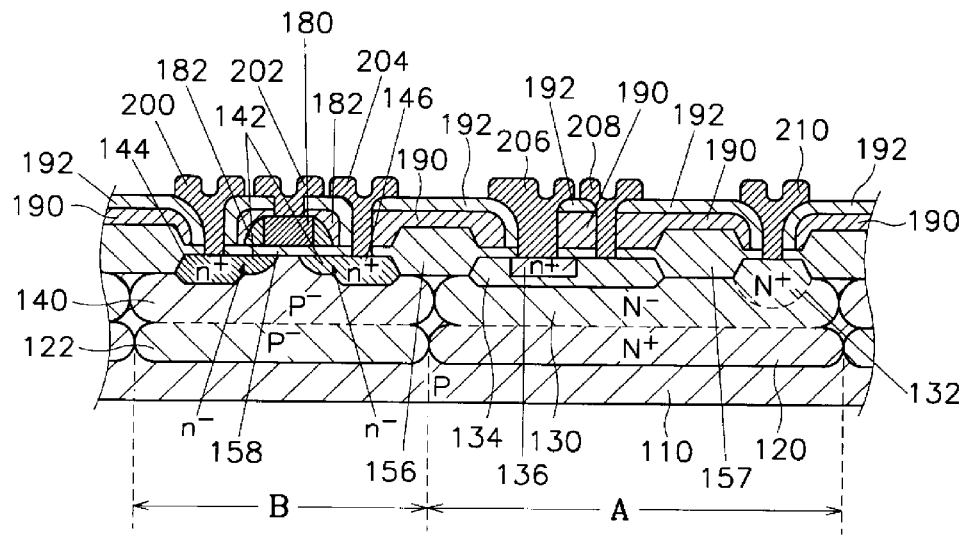
FIG. 1 is a sectional view of a conventional BiCMOS device.
Figure 2A:
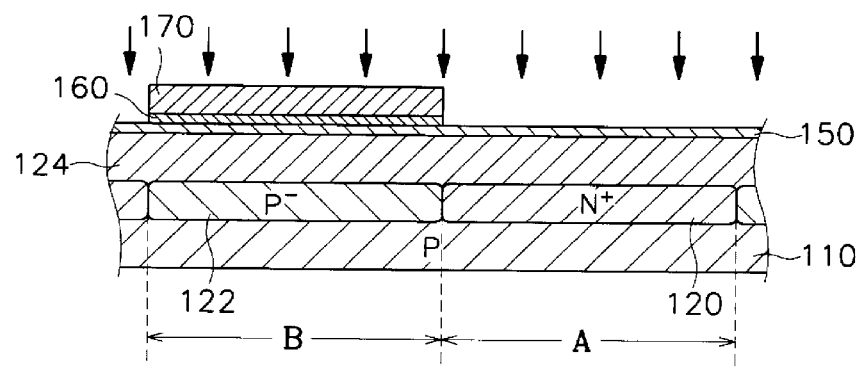
Figure 2B:
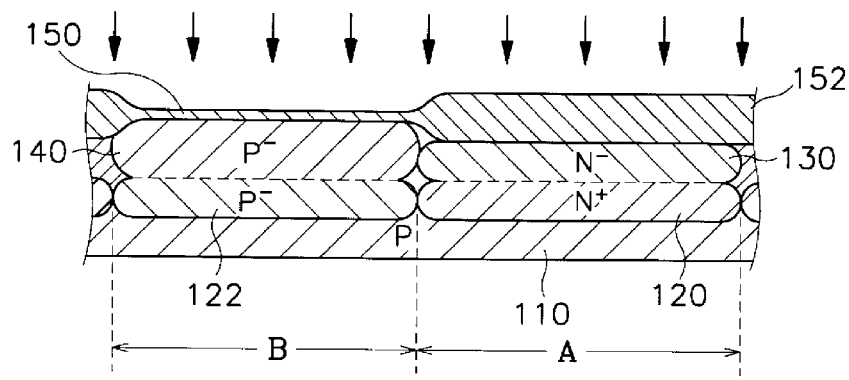
Figure 2C:
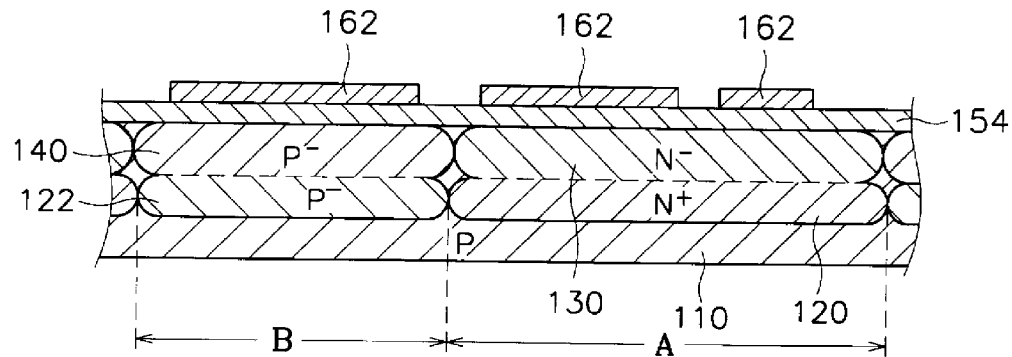
Figure 2D:
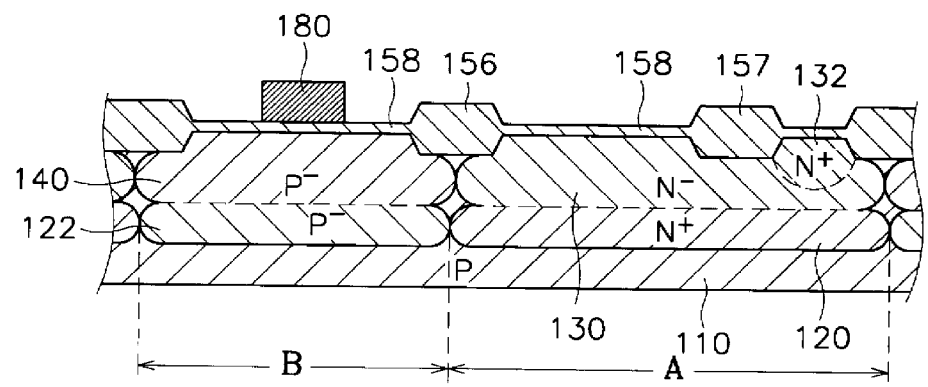
Figure 2E:
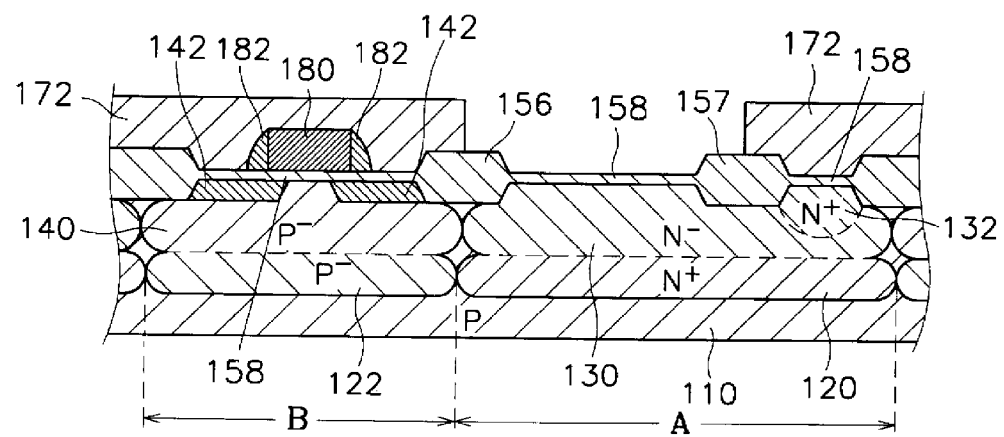

A BiCMOS device according the embodiment of the present invention is described with reference to FIGS. 3 to 4I. For convenience, the PMOSFET is not shown in the figures and not described. Moreover, the terms "first conductivity" and "second conductivity" refer to opposite conductive types such as P or N type.

FIG. 3 shows a cross sectional view of a BiCMOS device according to the embodiment of the present invention.

An NPN bipolar transistor is formed in the bipolar section A, while an NMOSFET being formed in the NMOSFET section B.

An N+buried layer 20 is formed on a silicon substrate 10 in the bipolar section A, and an N-well (or an N-epitaxial layer) 30 is formed on the N+buried layer 20. A P-well 40 adjacent to the N-well 30 is formed on the substrate 10 of the NMOSFET section B.

A deep collector region 32 in contact with the N+buried layer 20 is formed in the N-well 30. A base region consisting of an intrinsic base region 34 and an extrinsic base region 36 is formed in the N-well 30 so that the base region is separated from the collector region 32. An emitter region 38 is formed in the intrinsic base region 34.

A source region 44 and a drain region 46 separated from each other are formed in the P-well 40. LDD regions 42 are formed in the source region 44 and the drain region 46, respectively.

A thick oxide film 52 having a thin portion 50 is formed on the surface of the substrate in the bipolar and the NMOSFET sections A and B. The thin portion 50 serving as a gate oxide film 50 is formed on the surface between the LDD regions 42.

A first gate electrode 68 made of polysilicon is formed on the gate oxide film 50, and a first emitter electrode 69 made of polysilicon is formed on the emitter region 38. Silicide films 64 and 65 are formed on the first gate electrode 68 and the first emitter electrode 69.

The thick oxide film 52 has non-uniform thickness near the first gate electrode 68 and the first emitter electrode 69. The first gate electrode 68 and the first emitter electrode 69 have convex shapes. Therefore, the thick oxide film 52 has bird's beaks forwarding the electrodes 68 and 69 at the upper and the lower portions of the electrodes 68 and 69. As a result, since the thickness of the end portion of the gate oxide film 50, which is near the LDD regions 42, is thicker than that of center portion, the GIDL and the gate-drain overlapping capacitance is reduced. Concerning the bipolar section, there is a portion of the thick oxide film 52 below the side portion of the first emitter electrode 69 and over the side portions of the emitter region 38. When the emitter-base junction is reversely biased, N- channel is produced in the emitter region 38 because this structure serves as a gate of field effect transistor. Therefore, the hot carrier reliability is improved.

A CVD (chemical vapor deposition) oxide film 100 is formed on the thick oxide film 52. The oxide films 52 and 100 has a plurality of contact holes through which metal electrodes 99, 103, 107 and 109 and the regions 44, 46, 36 and 32 are connected respectively. The CVD oxide film 100 has contact holes through which a second gate electrode 101 and a second emitter electrode 105 are connected to the first gate electrode 68 and the first emitter electrode 69 via the silicide layers 64 and 65, respectively.

Next, a manufacturing method of the BiCMOS device shown in FIG. 3 is described with reference to section views of FIGS. 4A to 4I.

Figure 4A:
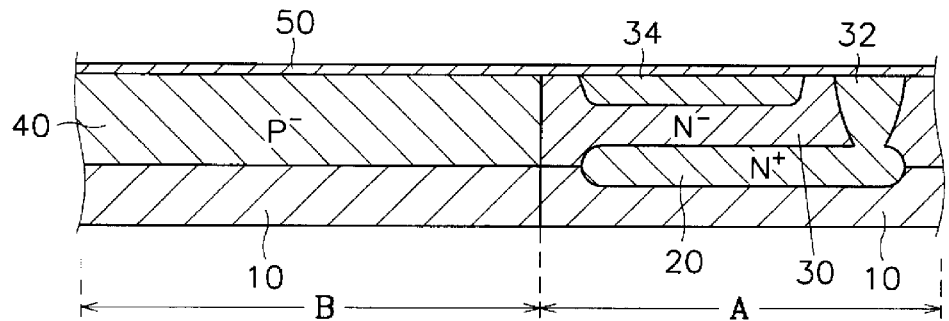
FIG. 4A to 4I are sectional views illustrating a method for manufacturing the BiCMOS device shown in FIG. 3.

As shown in FIG. 4A, an N+buried layer 20 is formed on a silicon substrate 10 in a bipolar section A, and an N-epitaxial layer 30 and a P-well 40 are formed on the N+buried layer 20 and the substrate 10 of the NMOSFET section, respectively. An N-well (not shown) may be formed in the N-epitaxial layer 30. The resistivity of the substrate 10 is 10–30 Ωcm and its crystal direction is (111) or (100). The resistance of the N+buried layer 20 is 10–30 Ωper unit area, and the resistivity and the thickness of the N-epitaxial layer 30 are 0.3–1.0 Ωcm and 0.8–2.0 μm, respectively. The resistance of the P-well 40 is 1–5 kΩper unit area.

A gate oxide film 50 with thickness of 70–200 Å is formed on the N-epitaxial layer 30 and the P-well 40. Phosphorous ions with dose 3E15–8E15 ions per cm$^2$ are implanted into the N-epitaxial layer 30 with an implantation energy of 30–80 keV, and then a deep collector region 32 is formed by a diffusion process. Subsequently, boron ions with dose 2E13–6E13 ions per cm$^2$ are implanted into the N-epitaxial layer 30 with the implantation energy of 15–30 keV, and then an intrinsic base region 34 is formed by the diffusion process. Sequentially, boron ions is implanted into the NMOSFET section B for adjusting a breakdown voltage under the condition that the concentration of the ions is 1E11–1E13 ions/cm$^2$ and the implantation energy is 15–30 keV.

Figure 4B:
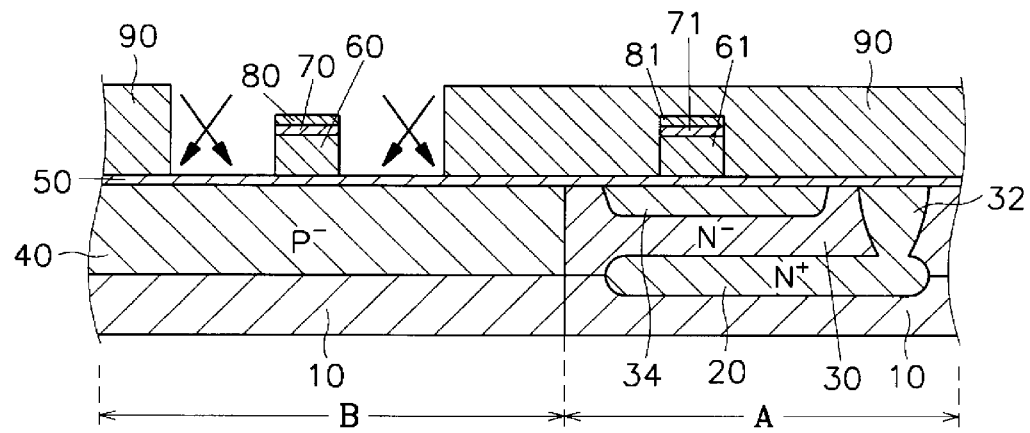

A polysilicon layer 60 and 61 is deposited with thickness of 1,000–3,000 Å and highly doped with N type impurities. A thin oxide film 70 and 71 and a nitride film 80 and 81 are sequentially deposited with thicknesses of 70–150 Å and 500–1,500 Å, respectively. As shown in FIG. 4B, the nitride film 80 and 81, the thin oxide film 70 and 71 and the polysilicon layer 60 and 61 are etched to form a gate pattern 60, 70 and 80 of the NMOSFET section B and a emitter pattern 61, 71 and 81 of the bipolar section A. A photoresist pattern 90 is formed on the surface of the bipolar section A, and the phosphorous ions is implanted in a large tilt angle with respect to the substrate 10 under the condition that the concentration of the ions are 1E12–1E14 ions/cm$^2$ and the implantation energy is 60–100 keV.

Figure 4C:
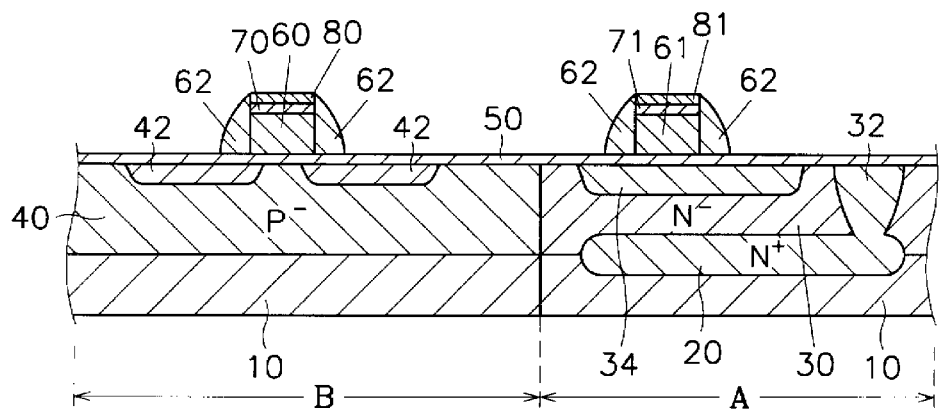

After the photoresist pattern 90 is removed, a low temperature oxide layer is deposited with thickness of 1,000 3,000 Å and is patterned by using a RIE method to form sidewalls 62 on the lateral sides of the gate pattern 60, 70 and 80 and the emitter pattern 61, 71 and 81, as shown in FIG. 4C. In this step, LDD regions 42 are formed in the P-well 40.

Figure 4D:
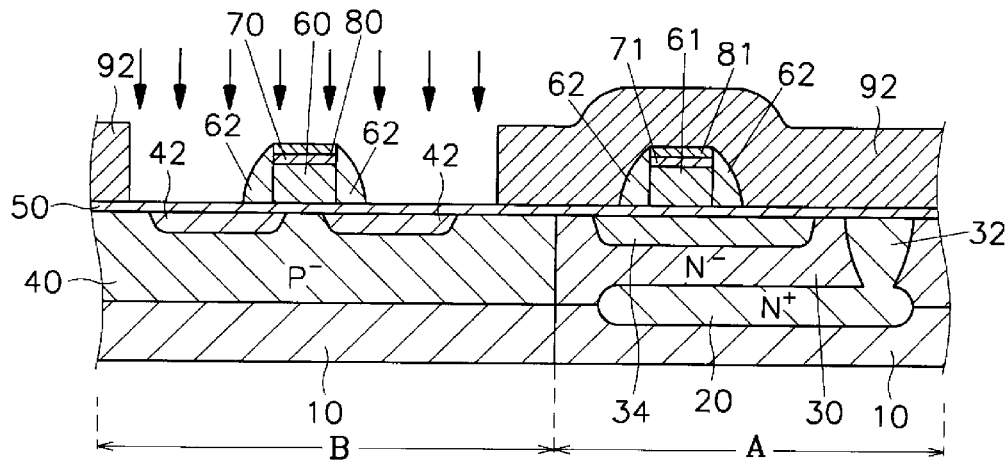

As shown in FIG. 4D, a photoresist pattern 92 is formed on the surface of the bipolar section A, and N type ions such as an arsenic are implanted under the condition that the concentration of the N type ions is 1E15–1E17 ions/cm$^2$ and the implantation energy is 40–80 keV. A source and a drain regions (not shown) will be formed in the later steps.

Figure 4E:
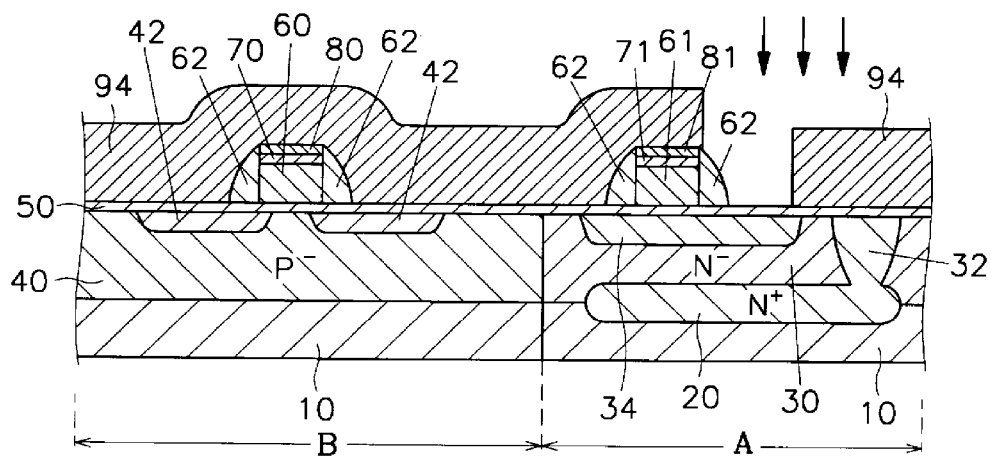

As shown in FIG. 4E, after the photoresist pattern 92 is removed and a photoresist pattern 94 is formed on a whole upper surface except the portion above the intrinsic base region 34. The boron ions is implanted under the condition that the concentration of the ions is 1E14–1E16 ions/cm$^2$ and the implantation energy is 30–60 keV. The substrate is annealed at the temperature of about 900° C.

Figure 4F:
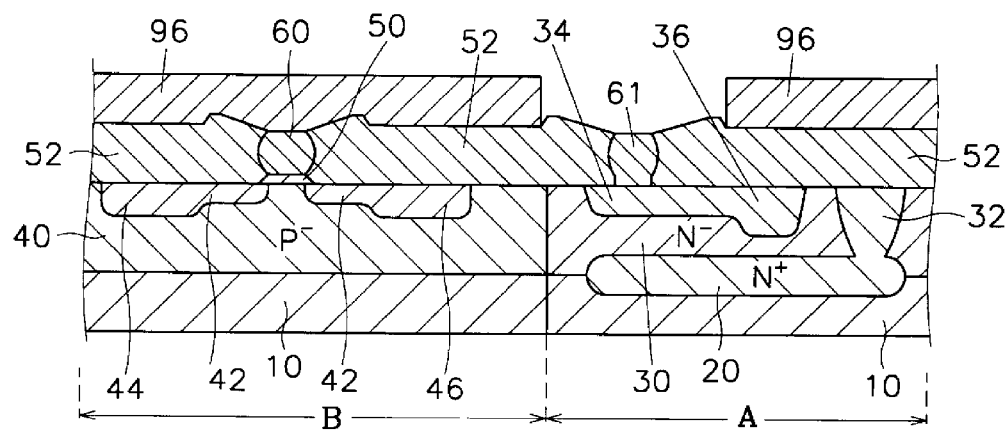

The photoresist pattern 94 is removed and an oxidation is performed to form a thick oxide film 52 with thickness of 2,000–5,000 Å. During the oxidation, bird's beaks forwarding the gate pattern 60, 70 and 80 and the emitter pattern 61, 71 and 81 are produced. A source and a drain regions 44 and 46 and an extrinsic base region 36 are formed in the P-well 40 and the N-epitaxial layer 30, respectively. The polysilicon layer 60 and 61 have convex shapes because of the bird's beak structure of the thick oxide film 52, as shown in FIG. 4F.

Figure 4G:
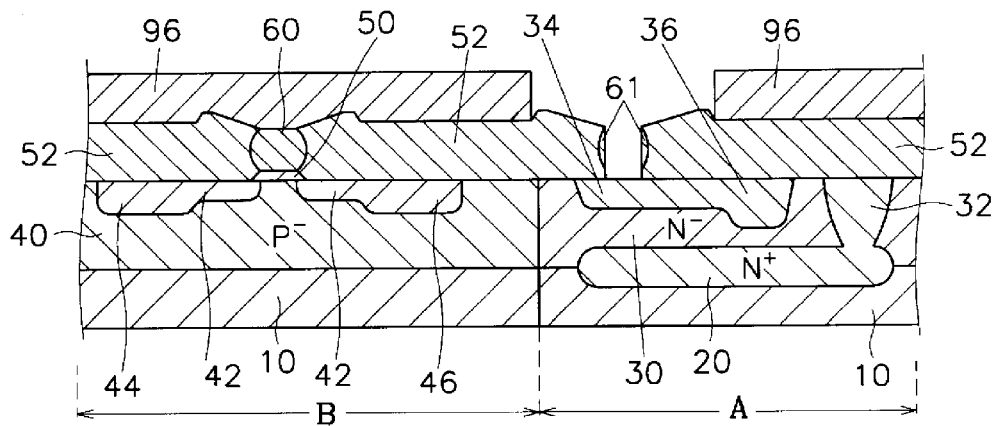

After the nitride film 80 and 81 and the oxide film 70 and 71 are removed, a photoresist pattern 96 exposing the polysilicon pattern 61 is formed. The polysilicon layer 61 of the emitter pattern and the gate oxide film 50 thereunder are removed by dry etching as shown in FIG. 4G. At this time, a convex portion of the polysilicon pattern is remained.

A polysilicon layer with thickness of 2,000–4,000 Å is deposited and highly doped with N type impurities such as arsenic under the condition that the concentration of the ions are 1E15–9E15 ions/cm$^2$ and the implantation energy is 40–80 keV. Then, a silicide layer such as tungsten silicide is deposited on the polysilicon layer with thickness of 150–600 Å.

Figure 4H:
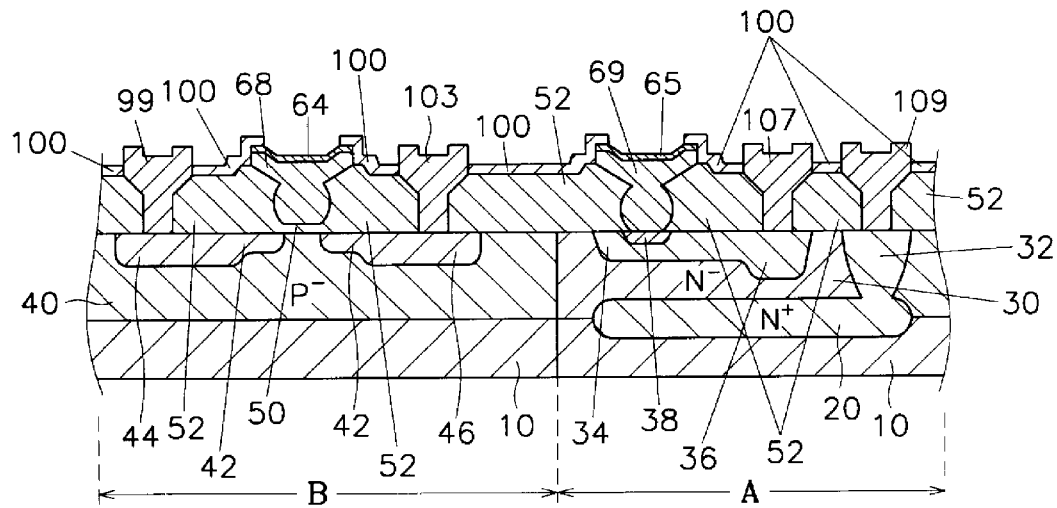

After a sintering step is performed at the temperature of about 900° C. to form an emitter region 38, the dose of the ion implantation into the polysilicon layer 69 determines the concentration of the emitter region 38. The polysilicon layer along with the silicide layer are patterned to form a first gate electrode 68 and a silicide electrode 64 thereon in the NMOSFET section B and the first emitter electrode 69 and a silicide electrode 65 thereon in the bipolar section A, as shown in FIG. 4H.

Figure 4I:
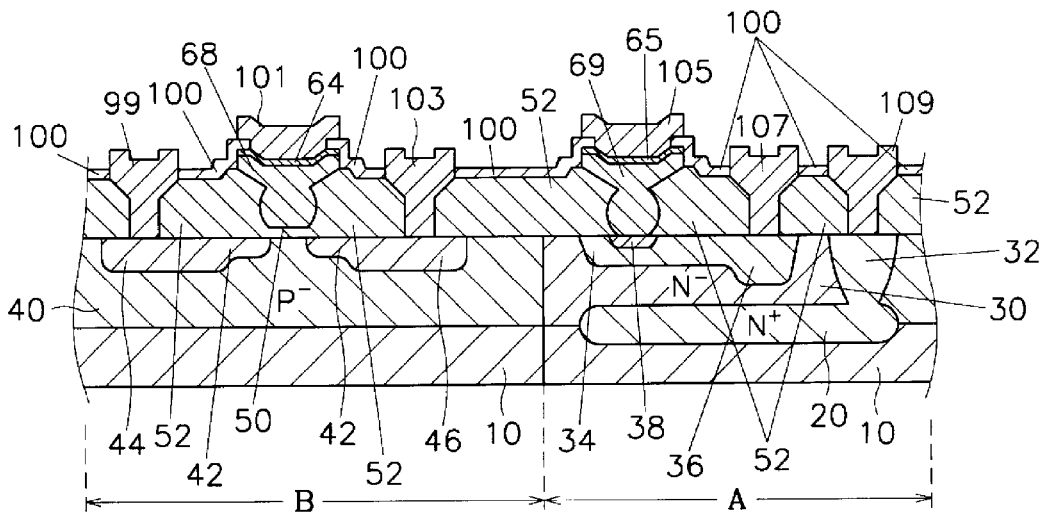

Finally, as shown in FIG. 4I, an oxide film 100 with thickness of 2,000–5,000 is deposited by CVD method and the oxide film is patterned along with the thick oxide film 52 having contact holes. A metal layer is deposited and patterned to form metal electrodes 99, 103, 107, 109, 101 and 105 in contact with the regions 44, 46, 36 and 32 and the first electrodes 68 and 69, respectively.

The invention thus being described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a BiCMOS device on a semiconductor substrate having an MOSFET section and a bipolar section comprising the steps of:

forming a first region of a first conductive type in the MOSFET section and a second region of a second conductive type in the bipolar section;

forming a first insulating layer on the surface of the first and the second regions;

forming a collector region having the second conductive type and an intrinsic base region having the first conductive type in the second region;

depositing a first polysilicon layer doped with impurities of the second conductive type, a first oxide film and a first nitride film on a top portion of the first insulating layer sequentially;

patterning the first nitride film, the first oxide film and the first polysilicon layer simultaneously to form a gate pattern in the MOSFET section and an emitter pattern above the intrinsic base region of the bipolar section;

implanting ions of the second conductive type into the first region to form lightly-doped regions in the first region;

forming sidewalls respectively on lateral sides of the gate pattern and the emitter pattern;

implanting ions of the second conductive type into the first region to form a source and a drain regions;

implanting ions of the first conductive type into the intrinsic base region to form an extrinsic base region;

performing oxidation process to form a second oxide film on the first and the second regions;

removing the first nitride film and the first oxide film of the gate pattern and the emitter pattern;

removing the first polysilicon layer of the emitter pattern and the first insulating layer below the emitter pattern;

depositing a second polysilicon layer doped with impurities of the second conductive type on the whole top surface of the MOSFET section and the bipolar section;

forming an emitter region by diffusing the impurities doped in the second polysilicon layer into the intrinsic base region; and patterning the second polysilicon layer to form a first gate electrode made of the first and the second polysilicon layers in the MOSFET section and the first emitter electrode contacting the emitter region in the bipolar section.

2. The method of claim 1, wherein the thickness of the first insulating layer is 70–200 Å.

3. The method of claim 1, wherein the second oxide film is formed by thermal oxidation.

4. The method of claim 1, wherein the thickness of the first polysilicon layer is 1,000–3,000 Å.

5. The method of claim 4, wherein the thickness of the second polysilicon layer is 2,000–4,000 Å.

6. The method of claim 1, further comprising the step of forming silicide layers on the first gate electrode and the second gate electrode.

7. The method of claim 6, wherein the thicknesses of the silicide layers are 150–600 Å.

8. The method of claim 7, further comprising the step of sintering the substrate.

9. The method of claim 8, wherein the sintering is performed at the temperature between 850–900 centigrades.

10. The method of claim 9, further comprising the step of forming a second insulating layer on the whole surface of the substrate.

11. The method of claim 10, wherein the second insulating layer is formed by chemical vapor deposition.

12. The method of claim 11, wherein the second insulating layer has thickness of 2,000–5,000 Å.

13. The method of claim 10, further comprising the steps of:

patterning the second insulating layer and the second oxide film to form contact holes on the source region, the drain region, the base region, the collector region and the silicide layers; and forming metal electrodes, each in contact with the source region, the drain region, the base region, the collector region and the silicide layers, respectively.

* * * * *